(12) United States Patent
Vuillermet et al.

(10) Patent No.: US 12,111,153 B2
(45) Date of Patent: Oct. 8, 2024

(54) ANGLE SENSOR

(71) Applicant: Allegro MicroSystems, LLC, Manchester, NH (US)

(72) Inventors: Yannick Vuillermet, Voglans (FR); Andreas P. Friedrich, Metz-Tessy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/344,295

(22) Filed: Jun. 10, 2021

(65) Prior Publication Data
US 2022/0397382 A1  Dec. 15, 2022

(51) Int. Cl.
| | | |
|---|---|---|
| *G01B 7/30* | (2006.01) | |
| *G01R 33/00* | (2006.01) | |
| *G01R 33/07* | (2006.01) | |
| *G01R 33/09* | (2006.01) | |

(52) U.S. Cl.
CPC ............ *G01B 7/30* (2013.01); *G01R 33/0047* (2013.01); *G01R 33/072* (2013.01); *G01R 33/091* (2013.01)

(58) Field of Classification Search
CPC ...... G01B 7/30; G01R 33/0047; G01R 33/07; G01R 33/072; G01R 33/075; G01R 33/077; G01R 33/09; G01R 33/091; G01R 33/093; G01R 33/095; G01R 33/096; G01R 33/098; G01R 33/0206; G01R 33/08; G01R 33/02; G01R 33/0094; G01R 33/0082;
(Continued)

(56) References Cited

U.S. PATENT DOCUMENTS

| 8,022,692 B2 | 9/2011 | Fernandez et al. |
| 9,377,285 B2 | 6/2016 | Romero et al. |
| 9,389,060 B2 | 7/2016 | Romero et al. |

(Continued)

FOREIGN PATENT DOCUMENTS

| DE | 19813569 | 4/1999 |
| DE | 102019211482 | 2/2021 |

(Continued)

OTHER PUBLICATIONS

Hal, "Stray-Field Robust 3D Position Sensor with Digital Output Interfaces" TDK-Micronas GmbH, May 7, 2020 Edition, 61 Pages.
(Continued)

*Primary Examiner* — David M Schindler
(74) *Attorney, Agent, or Firm* — Daly, Crowley, Mofford & Durkee, LLP (57) ABSTRACT

Methods and apparatus for prosing a sensor IC package having first and second sets of magnetic field sensing elements and a third set of magnetic field sensing elements located between the first and second positions, wherein the first, second, and third sets of magnetic field sensing elements have a first axis of sensitivity and a second axis of sensitivity, wherein the first and second axes of sensitivity are orthogonal. The sensor IC package is positioned in relation to a target comprising a two-pole magnet and the first and second axes of sensitivity are perpendicular to an axis about which the target rotates. Differential signals are processed to determine an absolute position of the target. A first secondary angle position is generated from the first and third sets of magnetic field sensing elements.

20 Claims, 10 Drawing Sheets

(58) Field of Classification Search
CPC .... G01R 33/0035; G01D 5/142; G01D 5/145; G01D 5/147; G01D 5/16; G01D 5/165
See application file for complete search history.

(56) References Cited

U.S. PATENT DOCUMENTS

| | | | |
|---|---|---|---|
| 9,664,497 B2 | 5/2017 | Kerdraon et al. | |
| 9,810,519 B2 | 11/2017 | Taylor et al. | |
| 9,823,092 B2 | 11/2017 | David et al. | |
| 9,869,566 B2 | 1/2018 | Tima et al. | |
| 10,254,103 B2 | 4/2019 | Taylor et al. | |
| 10,323,958 B2 | 6/2019 | Kranz et al. | |
| 10,408,639 B2 | 9/2019 | Hakspiel et al. | |
| 10,598,515 B2 | 3/2020 | Tima et al. | |
| 10,753,768 B2 | 8/2020 | David et al. | |
| 10,753,769 B2 | 8/2020 | David et al. | |
| 10,816,366 B2 | 10/2020 | Weiland et al. | |
| 10,866,122 B2 | 12/2020 | Weiland et al. | |
| 2002/0011840 A1 | 1/2002 | Li | |
| 2008/0040021 A1* | 2/2008 | Staniewicz | F01L 1/34 701/115 |
| 2012/0041691 A1 | 2/2012 | Fericean et al. | |
| 2015/0192433 A1* | 7/2015 | Onodera | G01D 5/145 324/207.21 |
| 2019/0234769 A1 | 8/2019 | Fontanet et al. | |
| 2019/0257671 A1* | 8/2019 | Osabe | G01D 5/12 |
| 2019/0312579 A1* | 10/2019 | Romero | G01R 33/077 |
| 2020/0300666 A1 | 9/2020 | David et al. | |
| 2020/0370924 A1* | 11/2020 | Bilbao De Mendizabal | G01D 18/008 |
| 2020/0400463 A1* | 12/2020 | Sogo | G01D 5/16 |
| 2021/0055131 A1* | 2/2021 | Dupre | G01B 7/30 |
| 2021/0270922 A1* | 9/2021 | Martens | A61B 5/1495 |
| 2022/0357144 A1 | 11/2022 | Tombez | |
| 2023/0093616 A1* | 3/2023 | Kimura | G01B 7/30 |

FOREIGN PATENT DOCUMENTS

| | | |
|---|---|---|
| GB | 2183044 | 5/1987 |
| WO | WO 2017-139082 | 8/2017 |

OTHER PUBLICATIONS

U.S. Appl. No. 17/232,440, filed Apr. 16, 2021, Diaconu, et al.
Allegro Microsystems, "Precision, High Speed, Hall-Effect Angle Sensor IC with Integrated Diagnostics for Safety-Critical Applications," A1339 Datasheet; Apr. 20, 2021; 95 Pages.
AMS, "3D Hall Position Sensor for Linear and Off-Axis Applications," AS5403A/D/E Datasheet; Feb. 12, 2020; 66 Pages.
Extended European Search Report dated Aug. 18, 2022 for European Application No. 22167116.7, 9 pages.
Response to U.S. Non-Final Office Action dated Jun. 30, 2022 filed on Jul. 18, 2022 for U.S. Appl. No. 17/232,440; 12 pages.
U.S. Notice of Allowance dated Aug. 23, 2022 for U.S. Appl. No. 17/232,440; 11 pages.
U.S. Non-Final Office Action dated Jun. 30, 2022 for U.S. Appl. No. 17/232,440; 9 pages.
Response to Extended European Search Report dated Aug. 18, 2022, filed on Apr. 18, 2023 for European Application No. 22167116.7, 23 pages.
Notice of Allowance dated Oct. 23, 2023 for European Application No. 22167116.7 with Allowed Specification; 58 Pages.

* cited by examiner

ANGLE SENSOR

BACKGROUND

Magnetic field sensors can be used in a variety of applications. In one application, a magnetic field sensor can be used to detect an angle of rotation of a ferromagnetic object. In another related application, a magnetic field sensor can be used to sense a rotation (e.g., a continuous or discontinuous rotation) of a ferromagnetic object.

Within a magnetic field sensor, planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to a magnetic field parallel to a surface of a substrate on which the vertical Hall element is formed. Also, within a magnetic field sensor, various types of magnetoresistance elements are known. Most types of magnetoresistance elements tend to be responsive to magnetic fields parallel to a surface of a substrate on which the magnetoresistance element is formed.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

SUMMARY

Embodiments of the disclosure provide methods and apparatus for a magnetic field sensor for angle and/or linear motion sensing. The sensor can include magnetic field sensing elements for generating signals that can be processed to determine angular position of a target, such as a rotating shaft, for example. In some embodiments, the magnetic field sensing elements comprise Hall sensing elements for 3D sensing, e.g., one planar and two vertical Hall plates to sense field in the X, Y, and Z dimensions, and analog and/or digital signal processing of the sensing element signals. In other embodiments, sets of magnetic field elements provide 2D sensing. In some embodiments, a sensor includes three sets of magnetic field sensing elements, such as 3D Hall plates, and operates in a single channel and/or differential mode. The differential mode enables rejection of common stray magnetic fields so that they do not corrupt the measurement of the target magnetic field. In embodiments, a sensor can report an angle calculated on-chip using the magnetic fields measured in any two of the three sensed axes and/or output field strengths measured in all three axes. Secondary angle position can be generated from the first and third sets of magnetic field sensing elements.

In example embodiments, a sensor determines an angle measurement for a target, such as a rotating shaft. An absolute angle measurement can be obtained using a turns counter, for example. In embodiments, a differential angle sensor is placed in front of a ring magnet having a diametrical magnetization, e.g., two poles. Illustrative sensor embodiments can obtain high accuracy side shaft angle measurements while achieving a stray field robust angle measurement.

Example applications for a sensor in accordance illustrative embodiments include automotive and industrial applications, such as throttle and valve position sensing, pedal position sensing, fork and clutch position sensing for transmission, and braking systems.

In one aspect, a method comprises: employing in a sensor IC package a first set of magnetic field sensing elements located at a first position and a second set of magnetic field sensing elements located at a second position, and a third set of magnetic field sensing elements located at a third position between the first and second positions, wherein the first, second, and third sets of magnetic field sensing elements have a first axis of sensitivity and a second axis of sensitivity, wherein the first and second axes of sensitivity are orthogonal, wherein the sensor IC package is positioned in relation to a target comprising a two-pole magnet, and wherein the first and second axes of sensitivity are perpendicular to an axis about which the target rotates; processing a first differential signal comprising signals for the first axis of sensitivity from the first and second sets of magnetic field sensing elements and a second differential signal comprising signals for the second axis of sensitivity from the first and second sets of magnetic field sensing elements to determine an absolute position of the target; and generating a first secondary angle position from the first and third sets of magnetic field sensing elements.

A method can further include one or more of the following features: the target comprises a shaft, determining the absolute position of the target within a quadrant from positive or negative signs of the first and second differential signals, the quadrant of the target is determined without arctangent processing of the first and second differential signals for low power operation, generating a second secondary angle position from the second and third sets of magnetic field sensing elements, comparing a difference between the absolute position of the target and the first secondary angle position to a threshold to evaluate operation of the sensor IC package, comparing a difference between the absolute position of the target and the first secondary angle position to a threshold to identify a fault in the sensor IC package, the first, second, and third sets of magnetic field sensing elements are located on a straight line, the third set of magnetic field sensing elements is located halfway between the first and second sets of magnetic field sensing elements, processing the first and second differential signals includes arctangent processing, a line connecting the first and second sets of magnetic field sensing elements is tangential to a surface of the target, the target comprises a ring magnet, and/or the target comprises a cylindrical magnet.

In another aspect, a sensor comprises: a sensor IC package having a first set of magnetic field sensing elements located at a first position and a second set of magnetic field sensing elements located at a second position, and a third set of magnetic field sensing elements located at a third position between the first and second positions, wherein the first, second, and third sets of magnetic field sensing elements have a first axis of sensitivity and a second axis of sensitivity, wherein the first and second axes of sensitivity are orthogonal, wherein when the sensor IC package is positioned in relation to a target comprising a two-pole magnet, and wherein the first and second axes of sensitivity are perpendicular to an axis about which the target rotates, the sensor IC package is configured to: process a first differential signal comprising signals for the first axis of sensitivity from the first and second sets of magnetic field sensing elements and a second differential signal comprising signals for the second axis of sensitivity from the first and second sets of magnetic field sensing elements to determine an absolute position of the target; and generate a first secondary angle position from the first and third sets of magnetic field sensing elements.

A sensor can further include one or more of the following features: the target comprises a shaft, the absolute position of the target is determined within a quadrant from positive or negative signs of the first and second differential signals, the quadrant of the target is determined without arctangent processing of the first and second differential signals for low power operation, a second secondary angle position is generated from the second and third sets of magnetic field sensing elements, the sensor IC package is further configured to compare a difference between the absolute position of the target and the first secondary angle position to a threshold to evaluate operation of the sensor IC package, the sensor IC package is further configured to compare a difference between the absolute position of the target and the first secondary angle position to a threshold to identify a fault in the sensor IC package, the first, second, and third sets of magnetic field sensing elements are located on a straight line, the third set of magnetic field sensing elements is located halfway between the first and second sets of magnetic field sensing elements, processing the first and second differential signals includes arctangent processing, a line connecting the first and second sets of magnetic field sensing elements is tangential to a surface of the target, the target comprises a ring magnet, and/or the target comprises a cylindrical magnet.

In a further aspect, a sensor comprises: a sensor IC package; a first magnetic field sensing means located at a first position and a second magnetic field sensing means located at a second position, and a third magnetic field sensing means located at a third position between the first and second positions, wherein the first, second, and third magnetic field sensing means have a first axis of sensitivity and a second axis of sensitivity, wherein the first and second axes of sensitivity are orthogonal, wherein when the sensor IC package is positioned in relation to a target comprising a two-pole magnet, and wherein the first and second axes of sensitivity are perpendicular to an axis about which the target rotates, the sensor IC package is configured to: process a first differential signal comprising signals for the first axis of sensitivity from the first and second magnetic field sensing means and a second differential signal comprising signals for the second axis of sensitivity from the first and second magnetic field sensing means to determine an absolute position of the target; and generate a first secondary angle position from the first and third magnetic field sensing means.

A sensor can further include one or more of the following features: the target comprises a shaft, the absolute position of the target is determined within a quadrant from positive or negative signs of the first and second differential signals, the quadrant of the target is determined without arctangent processing of the first and second differential signals for low power operation, a second secondary angle position is generated from the second and third magnetic field sensing means, the sensor IC package is further configured to compare a difference between the absolute position of the target and the first secondary angle position to a threshold to evaluate operation of the sensor IC package, the sensor IC package is further configured to compare a difference between the absolute position of the target and the first secondary angle position to a threshold to identify a fault in the sensor IC package, the first, second, and third s magnetic field sensing means are located on a straight line, the third magnetic field sensing means is located halfway between the first and second magnetic field sensing means, processing the first and second differential signals includes arctangent processing, a line connecting the first and second magnetic field sensing means is tangential to a surface of the target, the target comprises a ring magnet, and/or the target comprises a cylindrical magnet.

BRIEF DESCRIPTION OF THE DRAWINGS

The foregoing features of the invention, as well as the invention itself may be more fully understood from the following detailed description of the drawings, in which.

DETAILED DESCRIPTION

Before describing example embodiments of the disclosure, some information is provided. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, and a vertical Hall element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe an assembly that uses one or more magnetic field sensing elements in combination with an electronic circuit, all disposed upon a common substrate, e.g., a semiconductor substrate. Magnetic field sensors are used in a variety of applications, including, but not limited to, angle sensors that sense an angle of a direction of a magnetic field, angle sensors that sense an angle of rotation of a target object, and rotation sensors that sense rotation of a rotating target object (e.g., speed and direction of rotation).

Magnetic field sensors in the form of angle and/or rotation sensors that can sense an angle of rotation of a ferromagnetic object are described herein. As used herein, the term "magnetic field signal" is used to describe any circuit signal that results from a magnetic field experienced by a magnetic field sensing element.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be analog or digital.

As used herein, the term "module" can be used to describe a "processor." However, the term "module" is used more generally to describe any circuit that can transform an input signal into an output signal that is different than the input signal.

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks (e.g., processors or modules), it will be understood that the analog blocks can be replaced by digital blocks (e.g., processors or modules) that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two-state output signal indicative of an input signal being above or below a threshold level (or indicative of one input signal being above or below another input signal). However, the comparator can also be comprised of a digital circuit (e.g., processor or module) having an output signal or value with at least two states indicative of an input signal or value being above or below a threshold level (or indicative of one input signal or value being above or below another input signal or value), respectively, or a digital signal or value above or below a digital threshold signal or value (or another digital signal or value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "amplifier" is used to describe a circuit element with a gain greater than one, less than one, or equal to one.

As used herein, the terms "line" and "linear" are used to describe either a straight line or a curved line. The line can be described by a function having any order less than infinite.

Figure 1:
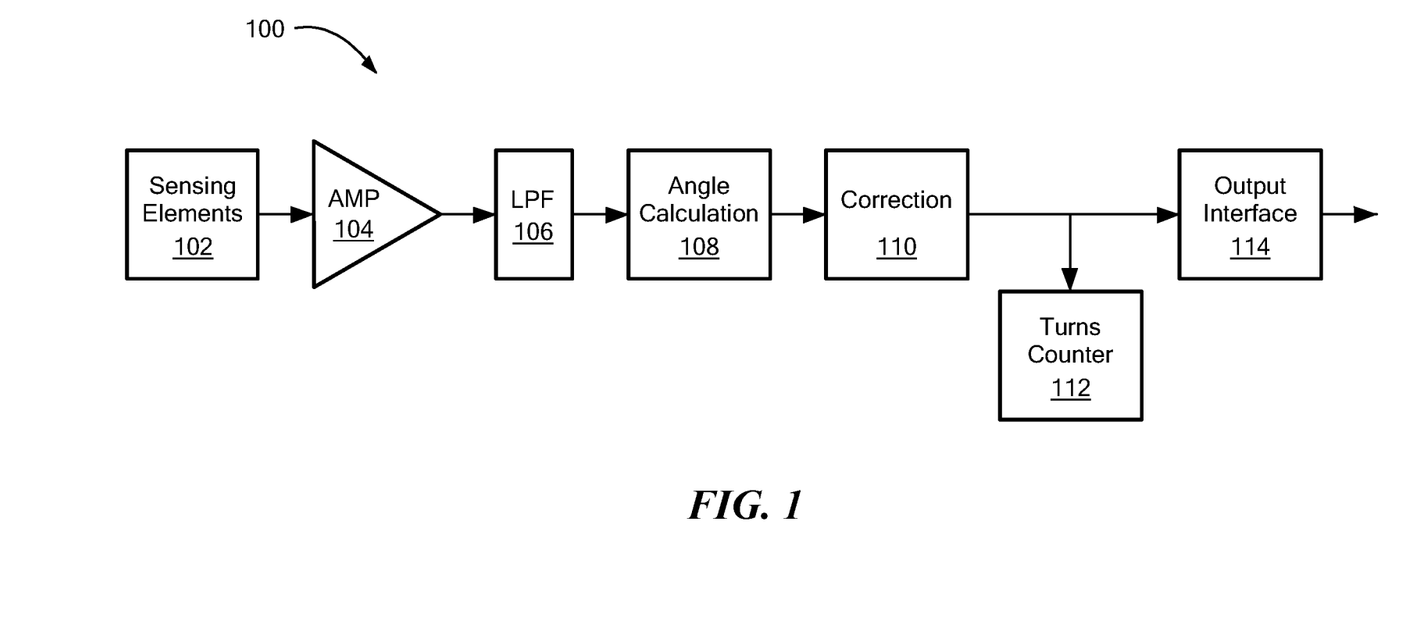
FIG. 1 is a block diagram of an example magnetic field sensor for providing angle and/or linear motion information for a target.

FIG. 1 shows an example block diagram of an angle sensor 100 having magnetic field sensing elements for providing differential signals that can be used by an arctangent function to generate angular position of a target. With this arrangement, a side shaft angle sensor, for example can achieve a stray field robust angle measurement with high accuracy.

The sensor 100 includes magnetic field sensing elements 102 to detect changes in a magnetic field caused by a moving target, such as rotating shaft. The magnetic field sensing elements 102 can comprise sets of sensing elements positioned to detect field changes in a desired manner, as described more fully below. In example embodiments, the magnetic field sensing elements 102 comprise Hall elements. An amplifier circuit 104 can amplify the signals from the sensing elements for filtering by a low pass filter 106. An angle calculation module 108 can determine an angle from the sensing element signals. A correction module 110 can provide various types of correction to the angle output signal from the angle calculation module 108. A turns counter module 112 can maintain a count of target rotations based on the angular position of the target. An output interface module 114 can output information in one or more formats to meet the needs of a particular application.

While shown in example embodiments in conjunction with a rotating shaft, illustrative sensors including channels having dedicated polarity, sensitivity, and offset correction that can be used in rotary and linear position applications. In embodiments, a sensor can have any mounting orientation relative to the sensing magnet to provide high accuracy and matching as the device and magnetic system changes over temperature. A sensor can be used for so-called slide—by applications where the travel exceeds the length that can be sensed by a conventional one-dimensional linear sensor. The angle output from example embodiments of a sensor is directly proportional to linear position. With linearization, stroke lengths greater than the length of the magnet can be realized.

In example embodiments, the output angle value is available in a SPI, SENT, PWM, and/or Analog Output options. Alternatively, the X, Y, and Z field strength values may be available to output in SPI and SENT protocols, for example. Along with the magnetic data, the SPI and SENT options can provide access to additional device information, such as temperature error flag information and customer identification register data.

Figure 2:
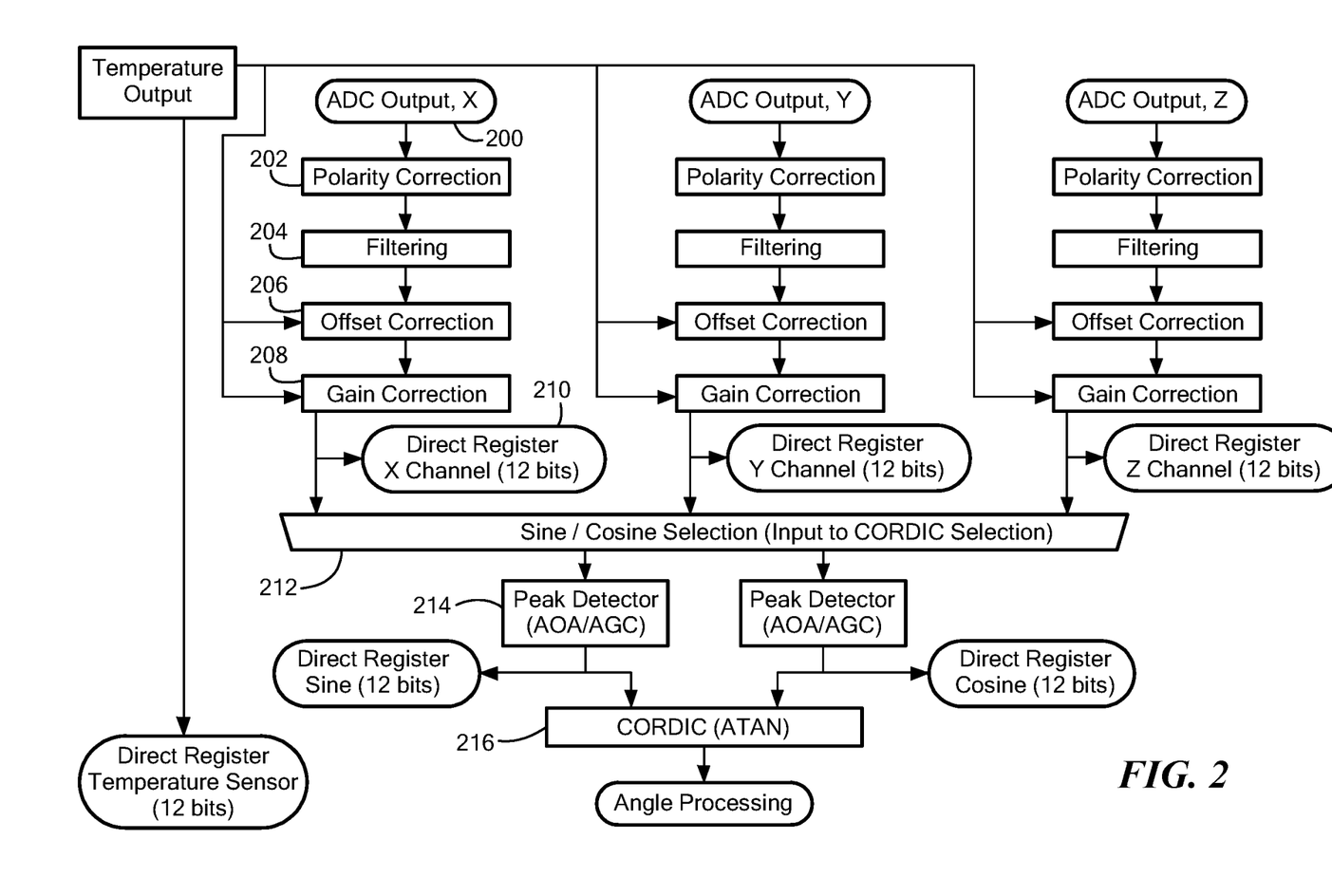
FIG. 2 is a diagram showing example processing performed by the sensor of FIG. 1.
Figure 3:
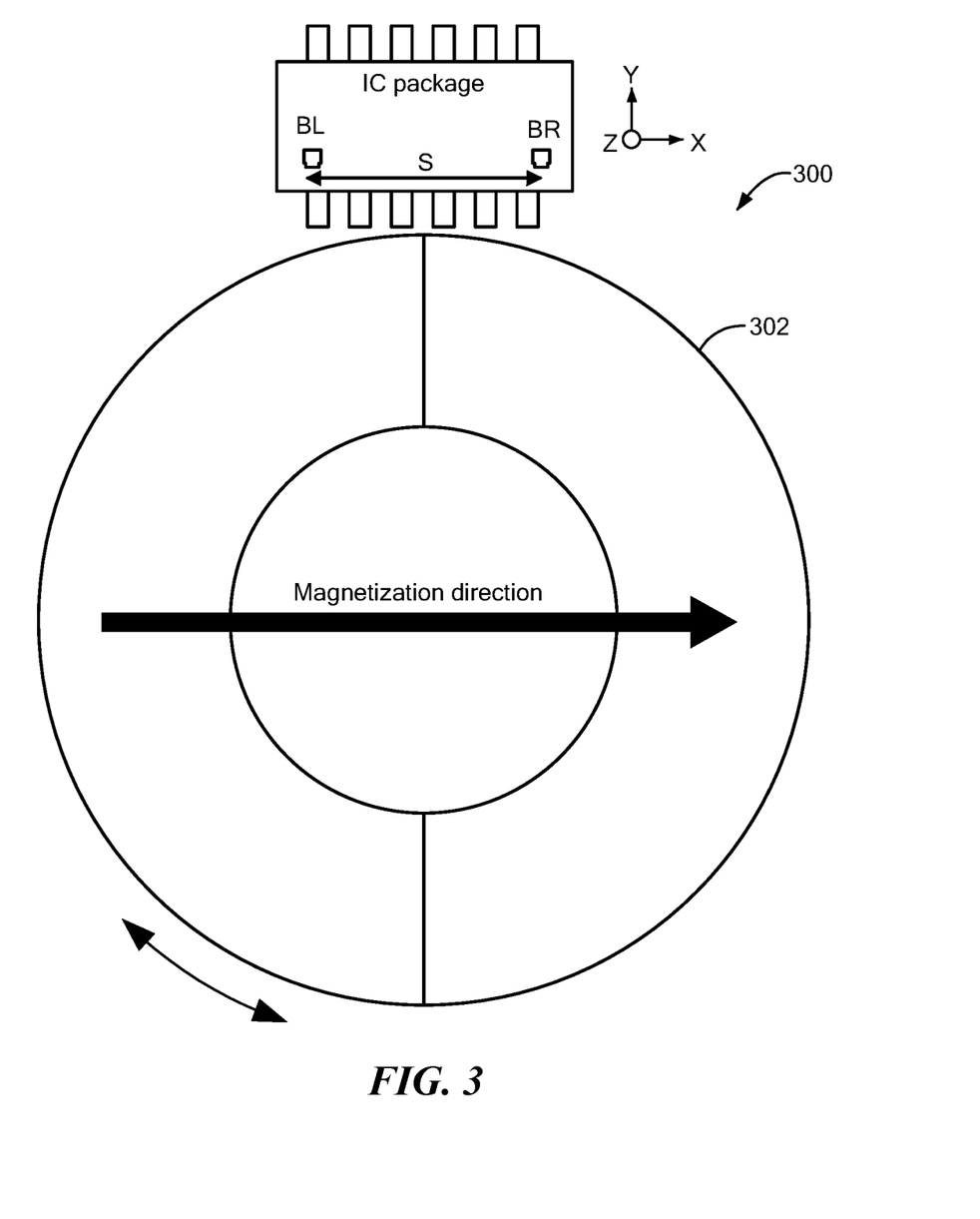
FIG. 3 is a top view representation of an example sensor positioned in relation to a target shown as a ring magnet.

FIG. 2 shows example processing steps to generate an angle output signal from an angle calculation module, such as the angle calculation module 108 of FIG. 1. It is understood that the example processing of FIG. 2 is for a 3D Hall element configuration capable of sensing magnetic fields in three orthogonal axes, which can be referred to as x, y and x axes. In embodiments, any two axes can be selected for angle calculation using arctangent processing, for example. FIG. 3, which is described below, shows an example 3D Hall element array capable of sensing in three axes.

In some embodiments, a sensor includes sensor arrays for two orthogonal axes of sensitivity for 2D sensing. Other embodiments can include sensing elements located between left and right sensor arrays, for example. Differential signals from the arrays of magnetic field sensing elements provide the inputs to the arctangent function.

In step 200, a digitized output from the magnetic field sensing elements that sense magnetic fields in the x axis is received. In step 202, polarity correction processing can be performed to determine direction of target rotation. In embodiments, a bit can designate the polarity of the angle reading of the device, such as by determining whether there is an increasing output for clockwise or counterclockwise rotation. In step 204, filtering of undesired signals can be performed. In step 206, offset correction can be performed and in step 208 gain correction can be performed. To provide the highest accuracy angle or position output from any orientation, in embodiments, each X, Y, and Z channel has gain and offset correction which allows mismatch between the orthogonal Hall plates to be corrected with high accuracy. This correction capability can be accomplished through a segment processor that allows placement of correction points across the temperature range of the device to provide consistent device performance over temperature. Sensor trim parameters can be adjusted to allow full system level temperature errors to be corrected. In step 210, the corrected signal from the X axis sensing elements can be stored in memory, such as a register.

In embodiments, processing similar to that described above for the x axis sensing elements signal can be performed for the y and z axis sensing elements and is not repeated.

In step 212, a multiplexer module receives signals for the x, y, and z sensing elements. It is understood that a multiplexer may not be required for 2D sensor configurations. In embodiments, signals for two of the three axes are selected for angle calculation processing. One signal is selected as a sine signal and the other signal is selected as a cosine signal. In step 214, peak detection for the selected signals is performed using Automatic Gain Correction and Automatic Offset Adjustment (AGC/AOA). Automatic gain and offset correction continuously correct for sensitivity and offset drift by using a min/max detector, for example. The min and max of each dimension input to the angle calculation module, e.g., CORDIC processing, and tracked over a selected number of peaks and averaged. From this, the offset and gain can be corrected to match the signal target offset and amplitude, keeping the output angle constant over lifetime and temperature variations. In embodiments, AOA processing automatically corrects offset error through the average of the peak values.

In step 216, angle calculation processing is performed. In embodiments, CORDIC (atan) processing is performed using the sine and cosine inputs from the selected sensing element signals. In order to calculate the angle output from the 3D sensing elements, a Coordinate Rotation Digital Computer (CORDIC) can be used. To allow for different orientations of the IC package, the sine and cosine inputs to the CORDIC are selectable to be any of the calibrated X, Y, and Z outputs The CORDIC processing uses arctangent to provide the angle between the two input vectors.

With this arrangement, a 3D Hall sensor IC is capable of performing an internal CORDIC calculation of the angular position of a target magnetic field based on any two axes of the three selectable axes (e.g., XY, XZ, or YZ). Each channel may have dedicated polarity, sensitivity, and offset correction that allows use in rotary and linear position applications in any mounting orientation relative to the sensing magnet.

In example embodiments of the disclosure, a 2D differential magnetic sensor is configured to calculate magnetic angle from the arctangent of two differential signals. The magnetic signal can be generated by a single two-pole magnet, i.e., diametrical magnetization. To generate the two differential signals, two sets of magnetic sensing elements can be placed at a given distance from each other and aligned along a tangential direction with respect to the target.

Figure 3A:
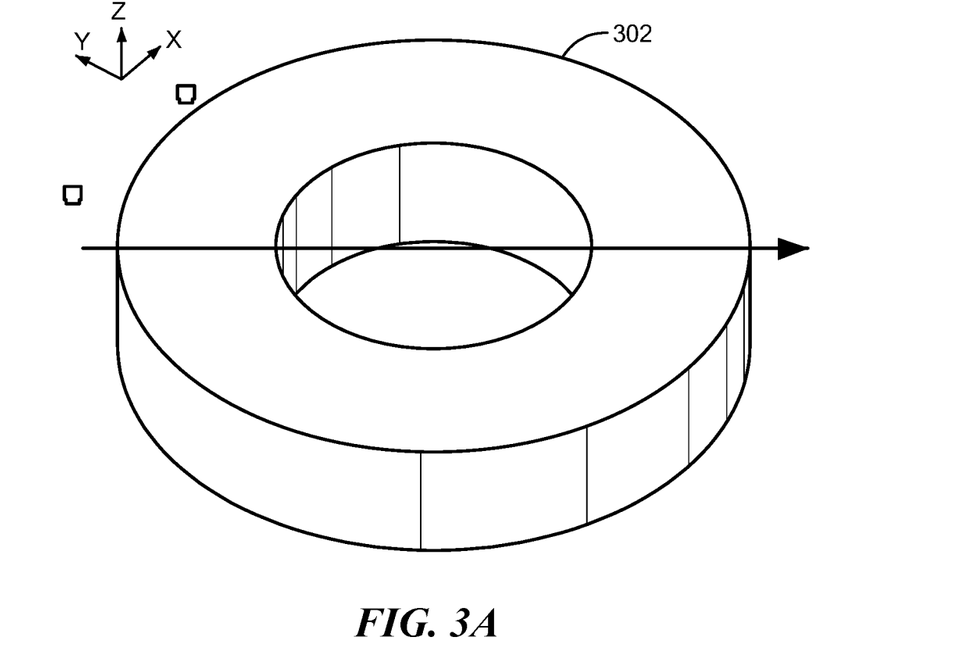
FIG. 3A is an isometric view of the ring magnet of FIG. 3.
Figure 3B:
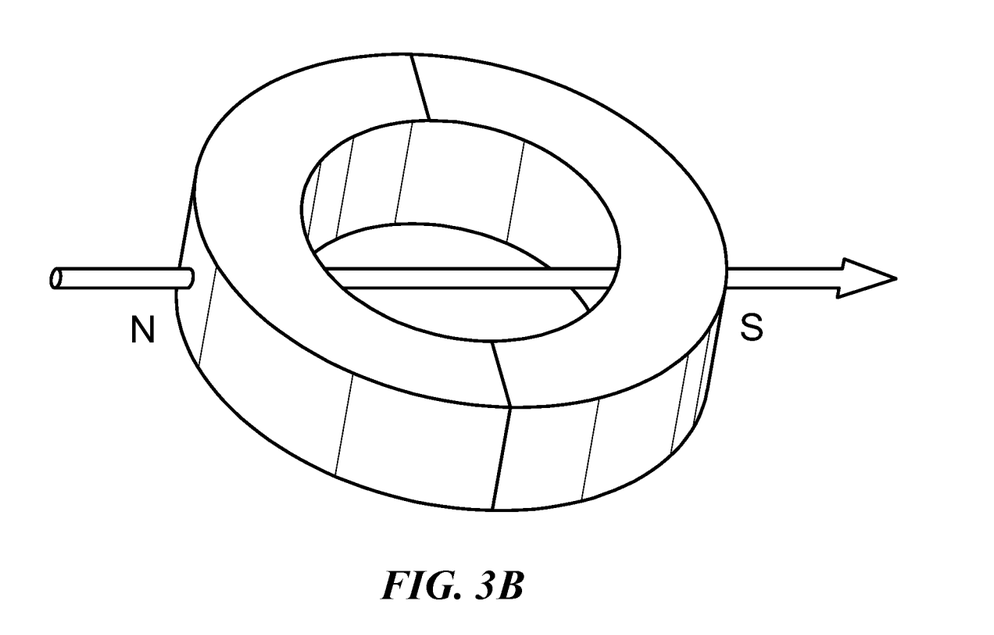
FIG. 3B is an isometric view of the ring magnet of FIG. 3A more clearly showing diametric magnetization.

FIG. 3 shows an example magnetic field sensor 300 for side-shaft or off-axis angle sensing using single-ended 2D magnetic field measurements. Embodiments of example sensors have stray field immunity provided by differential signal processing and angle linearity. The sensor 300 is shown in relation to x, y, and z axes. FIG. 3A shows an isometric view of a ring magnet 302 and FIG. 3B shows a further isometric view of a magnet having two-pole diametrical magnetization.

The ring magnet 302 has a main axis along the z axis about which the ring magnet rotates. The ring magnet 302 has a diametrical magnetization, which is equivalent to a two-pole magnetization. For example, in FIG. 3 along the x axis for the ring magnet 302 the angle position θ=0° for the illustrated side shaft configuration.

The sensor 300 includes a first set of magnetic sensing elements BL spaced from a second set of magnetic sensing elements BR by a distance S. In embodiments, the first set BL is placed at x=−S/2 and the second set BR is placed at x=S/2. The sensing elements can comprise Hall, magnetoresistive, flux gate, or other suitable type of suitable magnetic field sensing element. The first and second sets of magnetic field sensing elements BL, BR measure the magnetic fields along X and Y axes to provide four measurements: BLx, BLy, BRx and BRy.

In embodiments, first and second differential channels can be generated from these measurements:

$$\Delta Bx = BLx - BRx; \text{ and}$$

$$\Delta By = BLy - BRy.$$

The first and second channel signals are substantially immune to a common mode stray field since it is cancelled out during the differential operation. If, for example, a common mode stray field Bsx is applied along x axis to both BL and BR, then $\Delta Bx = (BLx+Bsx)−(BRx+Bsx)=BLx−BRx$.

In embodiments, angular position of the target, shown as the ring magnet 302 is given by:

$$\theta c = \text{atan}(\Delta Bx/\Delta By) + \theta o,$$

where $\theta o$ is an offset to account for the initial magnet angle position.

Figure 4A:
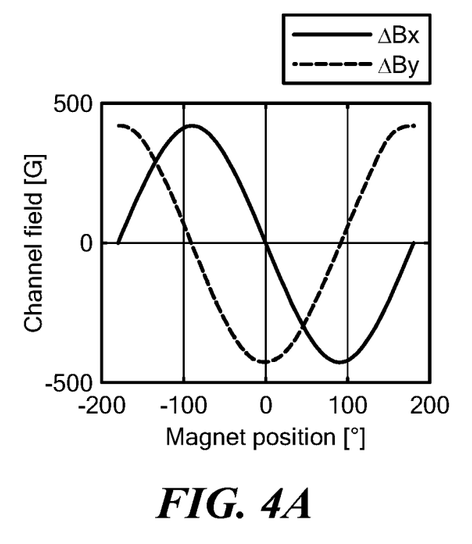
FIG. 4A is a waveform of first and second differential signals generated by first and second sets of magnetic field sensing elements.

FIG. 4A shows example signals for first and second channel signals $\Delta Bx$ and $\Delta By$ that can be generated by the arrangement shown in FIG. 3. In the illustrated embodiments, the first channel signal $\Delta Bx$ and the second channel signal $\Delta By$ are ninety degrees out of phase, i.e., in quadrature. The channel signals $\Delta Bx$ and $\Delta By$ are shown over 360 degrees (from −180 degrees to +180 degrees).

Figure 4B:
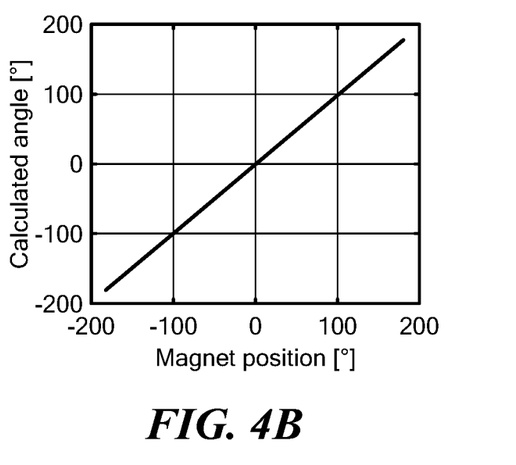
FIG. 4B is a waveform of angular target position calculation from the first and second differential signals of FIG. 4A.

FIG. 4B shows the target, e.g., ring magnet, position as calculated $\theta c$ from atan($\Delta Bx/\Delta By$) for the channel signals shown in FIG. 4A.

Figure 4C:
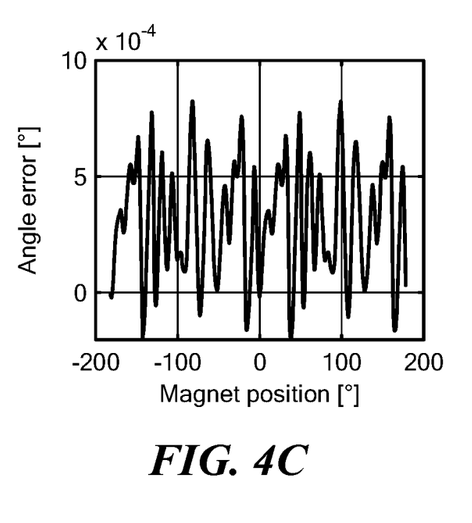
FIG. 4C is a waveform diagram of angle error for the signals of FIG. 4A.
Figure 4D:
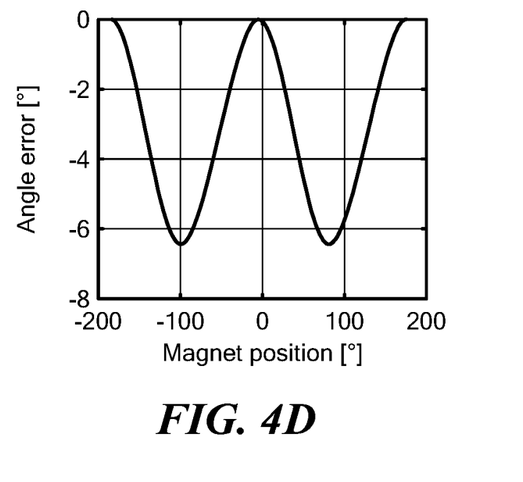
FIG. 4D is a waveform diagram of angle error when sensing element displacement is present.

FIG. 4C shows the corresponding angle error: $\theta err = \theta c − \theta$. In an ideal case, using a ring magnet and without measurement error or mechanical placement tolerance, the angular error is intrinsically zero. Note that angle error is shown for $10^{-4}$. However, example sensor misplacement induces some non-linearity as shown in FIG. 4D where BL and BR sensor locations are slightly shifted along x direction. Angle linearization may be useful to address the non-linearity.

While example embodiments are shown in conjunction with a ring magnet, it is understood that a target can have any practical geometry to meet the needs of a particular application. For example, a cylindrical magnet can be used. Any arbitrary magnet shape can be used as long as the magnetization is perpendicular to the axis of rotation. However, a ring magnet or cylindrical magnet may be useful to achieve an ideal intrinsic magnetic angle.

Referring again to FIG. 4A, it can be seen that the signs of the two differential channels can be used to detect the quadrant in which the magnet is located. By looking at the sign information of the differential channels, there is no need to compute the current angle by using the arctangent function. In embodiments, comparators can be used to identify the quadrant. With this arrangement, IC current consumption for an example IC embodiment can be very low while only looking at the quadrants. Table 1 shows an example method for determining the quadrant in which a target is located.

TABLE 1

| Sign($\Delta Bx$) | Sign($\Delta By$) | Quadrant |
|---|---|---|
| + | + | −180° to −90° |
| + | − | −90° to 0° |

TABLE 1-continued

| Sign($\Delta Bx$) | Sign($\Delta By$) | Quadrant |
|---|---|---|
| − | − | 0° to 90° |
| − | + | 90° to 180° |

It is understood that in other embodiments thresholds other than zero can be used to determine the quadrant.

Figure 5:
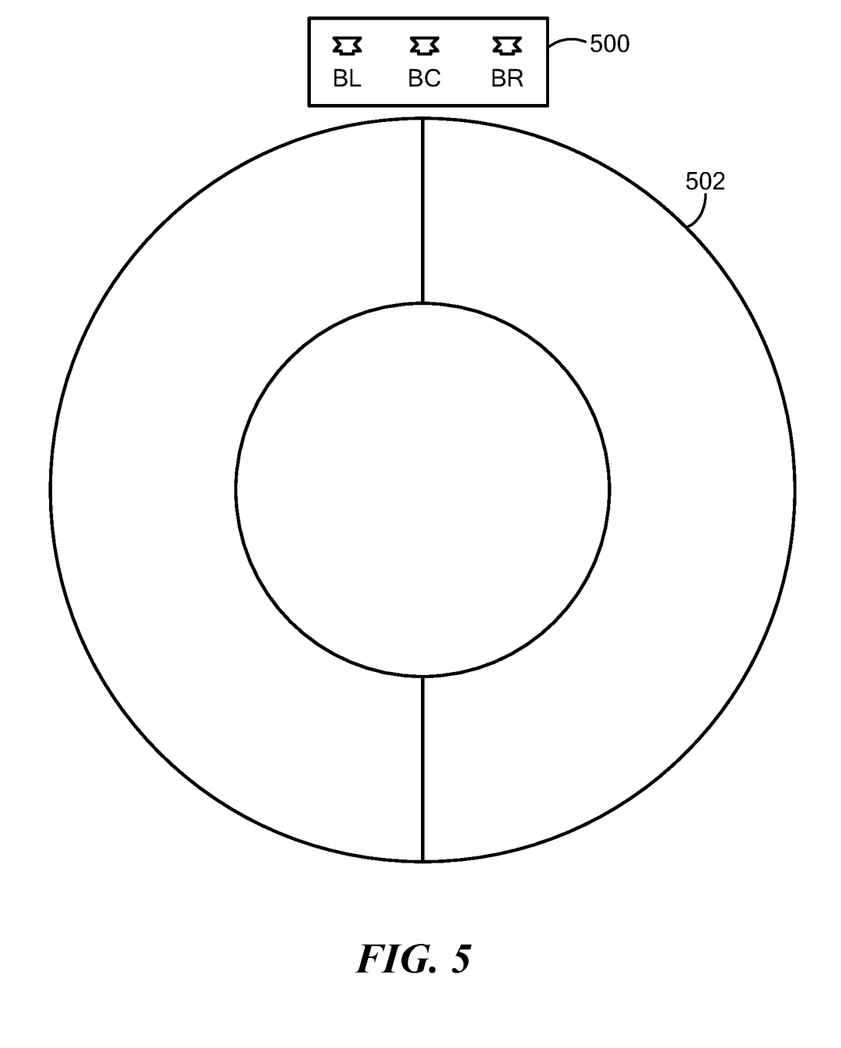
FIG. 5 is a top view representation of an example sensor positioned in relation to a target shown as a ring magnet, where the sensor includes first, second, and third sets of magnetic field sensing elements.

FIG. 5 shows an example sensor 500 for detecting target 502 position where the sensor includes a third set of magnetic field sensing elements BC in between left BL and right BR sensing element sets, such as those shown in FIG. 3 where like reference numbers indicate like elements. In embodiments, the third set of sensing elements BC is located in the middle of the BL and BR sets. In other embodiments, BC can be located shifted toward the left or right set of sensing elements BL, BR. In embodiments, the third set of sensing elements BC is located on a line extending from BL to BR. In other embodiments, BC may be somewhat above or below a line extending from BL to BR. The magnetic fields sensed by the third set of sensing elements can be referred to as BCx and BCy which can be used to generate additional angle measurements:

$$\Delta Bx_L = BLx - BCx \text{ and } \Delta By_L = BLy - BCy$$

From $\Delta Bx_L$ and $\Delta By_L$ it follows that $$\theta cL = \text{atan}(\Delta Bx_L/\Delta By_L) + \theta o$$

where $\theta o$ is an offset value.
Similarly, $$\theta cR = \text{atan}(\Delta Bx_R/\Delta By_R) + \theta o$$

where $\Delta Bx_R = BCx - BRx$ and $\Delta By_R = BCy - BRy$

Thus, three angle measurements are available: a main angle measurement $\theta c$ and two secondary measurements $\theta cL$ and $\theta cR$.

Figure 6A:
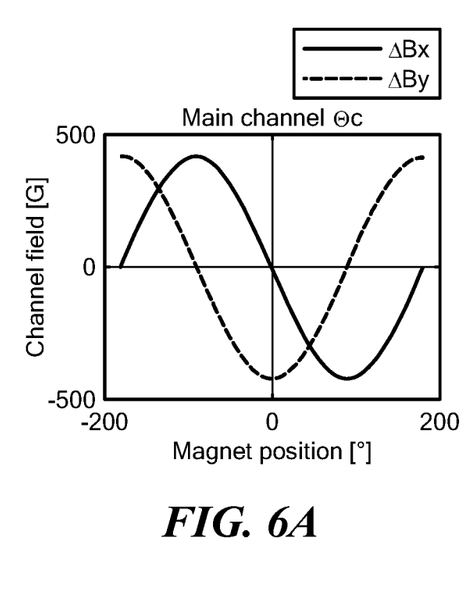
FIG. 6A shows first and second differential signals for a main channel.
Figure 6B:
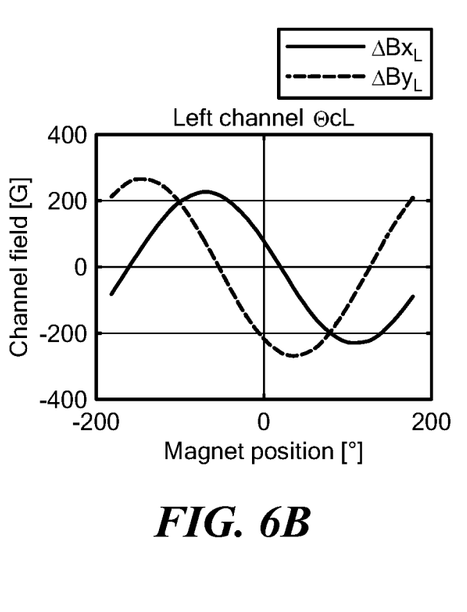
FIG. 6B shows first and second differential signals for a left channel.
Figure 6C:
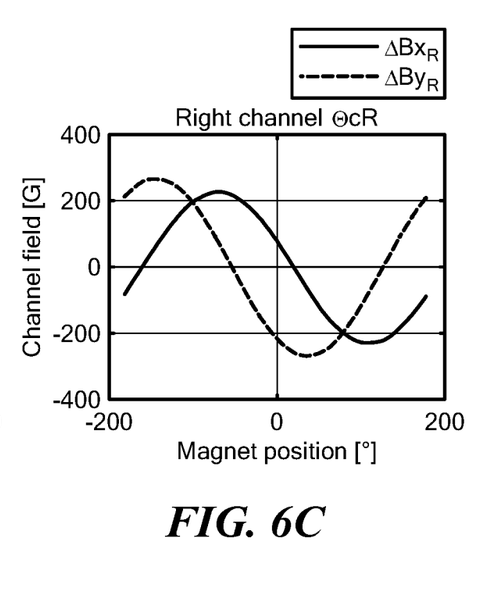
FIG. 6C shows first and second differential signals for a right channel.

Example waveforms for the sensor 500 and target 502 configuration of FIG. 5 are shown in FIGS. 6A-6I. FIG. 6A shows signals for $\Delta Bx$ and $\Delta By$ which may be similar to the signals shown in FIG. 4A. FIG. 6B shows signals for $\Delta Bx_L$ and $\Delta By_L$, as shown above, and FIG. 6C shows signals for $\Delta Bx_R$ and $\Delta By_R$.

Figure 6D:
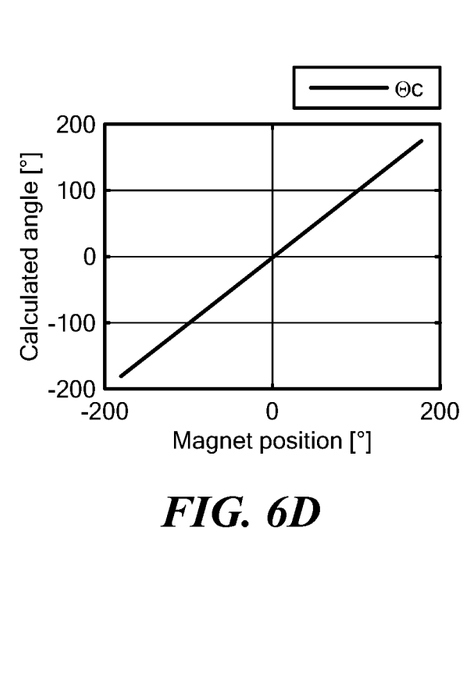
FIG. 6D shows angle position for a target for the main channel of FIG. 6A.
Figure 6E:
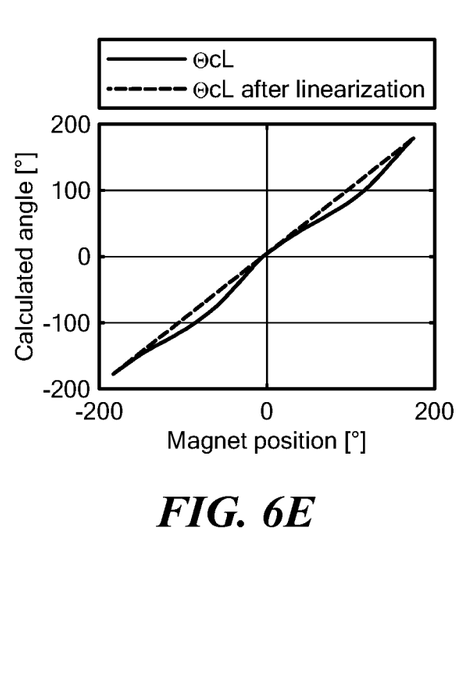
FIG. 6E shows angle position for a target for the left channel of FIG. 6B.
Figure 6F:
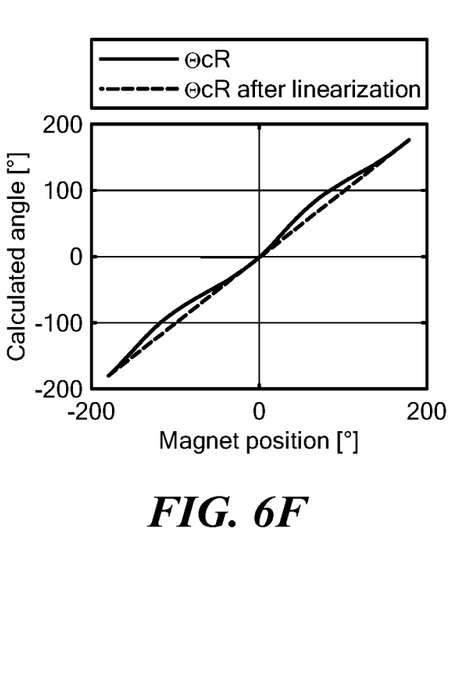
FIG. 6F shows angle position for a target for the right channel of FIG. 6C.
Figure 6G:
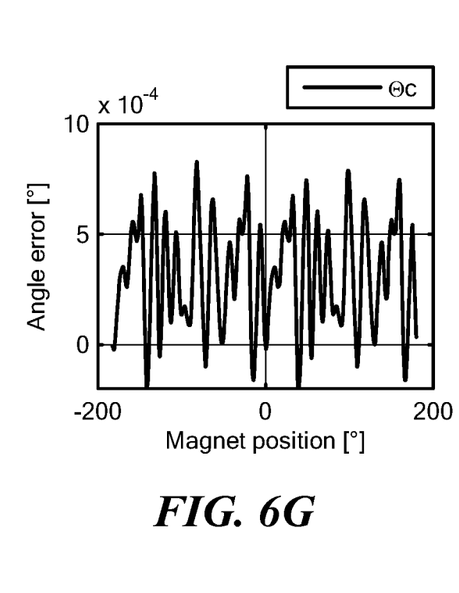
FIG. 6G shows angle error for the main channel of FIG. 6A.
Figure 6H:
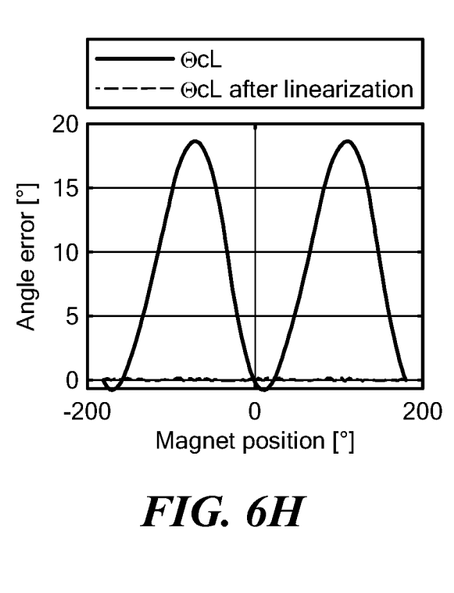
FIG. 6H shows angle error for the left channel of FIG. 6A.
Figure 6I:
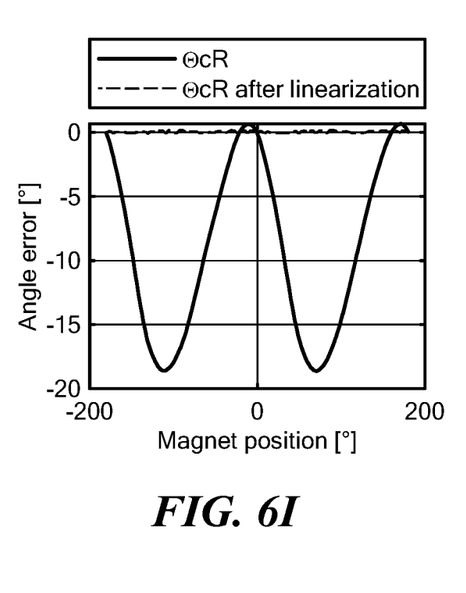
FIG. 6I shows angle error for the right channel of FIG. 6C.

FIG. 6D shows magnet position $\theta c$ based on the signals for $\Delta Bx$ and $\Delta By$ shown in FIG. 6A. FIG. 6E shows magnet position $\theta cL$ from the signals shown in FIG. 6B before and after linearization. FIG. 6F shows magnet position $\theta cR$ from the signals shown in FIG. 6C before and after linearization. FIGS. 6G-I show angle error for $\theta c$, $\theta cL$ and $\theta cR$, respectively.

In embodiments, angle errors in the second signals $\theta cL$ and $\theta cR$ can be reduced using segmented linearization, for example. Let's call $\theta cLa$ and $\theta cRa$ the secondary calculated angles after linearization. During operation, these angles $\theta c$, $\theta cLa$ and $\theta cRa$ can be compared: if a discrepancy between these calculated angles is detected (for example |$\theta c−\theta cLa$|>3° or |$\theta cLb−\theta cLa$|>3°), this may be indicative of a fault, such as a failure in the IC, magnet displacement or loosening, etc. A diagnostic flag can be generated and sent to a remote computer, such as an engine control unit (ECU).

Figure 7:
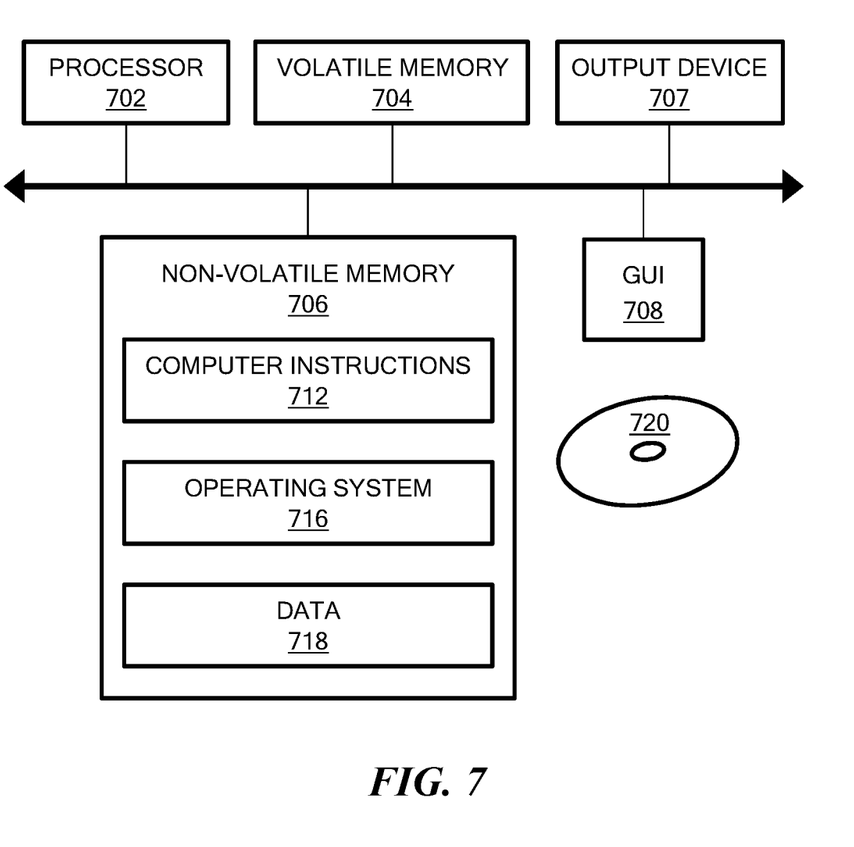
FIG. 7 is a schematic representation of an example computer than can perform at least a portion of the processing described herein.

FIG. 7 shows an exemplary computer 700 that can perform at least part of the processing described herein. The computer 700 includes a processor 702, a volatile memory 704, a non-volatile memory 706 (e.g., hard disk), an output device 707 and a graphical user interface (GUI) 708 (e.g., a mouse, a keyboard, a display, for example). The non-volatile memory 706 stores computer instructions 712, an operating system 716 and data 718. In one example, the computer instructions 712 are executed by the processor 702 out of volatile memory 704. In one embodiment, an article 720 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array) and/or an ASIC (application-specific integrated circuit)).

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A method, comprising:
    employing in a sensor IC package a first set of magnetic field sensing elements located at a first position and, a second set of magnetic field sensing elements located at a second position, and a third set of magnetic field sensing elements located at a third position, wherein the first, second, and third sets of magnetic field sensing elements each have a first magnetic field sensing element, not shared with any other of the first, second or third sets, with a first axis of sensitivity and a second magnetic field sensing element, not shared with any other of the first, second or third sets, with a second axis of sensitivity, wherein the first and second axes of sensitivity are orthogonal, and wherein the first, second, and third sets of magnetic field sensing elements are aligned and spaced apart from each other on a common line, wherein the sensor IC package is positioned in relation to a target comprising a two-pole magnet, and wherein the first and second axes of sensitivity and the common line are perpendicular to an axis about which the target rotates;
    processing a first differential signal comprising signals for the first axis of sensitivity from the first and second sets of magnetic field sensing elements and a second differential signal comprising signals for the second axis of sensitivity from the first and second sets of magnetic field sensing elements to determine an absolute position of the target, said processing including performing offset and gain correction on the first and second differential signals;
    generating a first secondary angle position from the first and third sets of magnetic field sensing elements;
    comparing a difference between the absolute position of the target and the first secondary angle position to a first threshold; and
    identifying a fault in the sensor IC package based on said comparison.

2. The method according to claim 1, wherein the target comprises a shaft.

3. The method according to claim 1, further including determining the absolute position of the target within a quadrant from positive or negative signs of the first and second differential signals.

4. The method according to claim 3, wherein the quadrant of the target is determined without arctangent processing of the first and second differential signals for low power operation.

5. The method according to claim 1, wherein the third set of magnetic field sensing elements is located halfway between the first and second sets of magnetic field sensing elements.

6. The method according to claim 1, wherein the processing of the first and second differential signals includes arctangent processing.

7. The method according to claim 1, wherein the target comprises a ring magnet.

8. The method according to claim 1, wherein the target comprises a cylindrical magnet.

9. The method according to claim 1, wherein the first set of magnetic field sensing elements comprises a left side set of magnetic field sensing elements, the second set of magnetic field sensing elements comprises a right side set magnetic field sensing elements, and the third set of magnetic field sensing elements comprises an in between set of magnetic field sensing elements.

10. The method according to claim 1, further comprising generating a second secondary angle position from the second and third sets of magnetic field sensing elements.

11. A sensor, comprising:
    a sensor IC package having a first set of magnetic field sensing elements located at a first position and a second set of magnetic field sensing elements located at a second position, and a third set of magnetic field sensing elements located at a third position between the first and second positions, wherein the first, second, and third sets of magnetic field sensing elements each have a first magnetic field sensing element, not shared with any other of the first, second or third sets, with a first axis of sensitivity and a second magnetic field sensing element, not shared with any other of the first, second or third sets, with a second axis of sensitivity, wherein the first and second axes of sensitivity are orthogonal, and wherein the first, second, and third sets of magnetic field sensing elements are aligned and spaced apart from each other on a common line, wherein the sensor IC package is configured to:

process a first differential signal comprising signals for the first axis of sensitivity from the first and second sets of magnetic field sensing elements and a second differential signal comprising signals for the second axis of sensitivity from the first and second sets of magnetic field sensing elements to determine an absolute position of a target comprising a two-pole magnet, wherein the first and second axes of sensitivity and the common line are perpendicular to an axis about which the target rotates, said processing including performing offset and gain correction on the first and second differential signals;

generate a first secondary angle position from the first and third sets of magnetic field sensing elements;

compare a difference between the absolute position of the target and the first secondary angle position to a first threshold; and identify a fault in the sensor IC package based on said comparison.

12. The sensor according to claim 11, wherein the absolute position of the target is determined within a quadrant from positive or negative signs of the first and second differential signals.

13. The sensor according to claim 12, wherein the quadrant of the target is determined without arctangent processing of the first and second differential signals for low power operation.

14. The sensor according to claim 11, wherein the third set of magnetic field sensing elements is located halfway between the first and second sets of magnetic field sensing elements.

15. The sensor according to claim 11, wherein the processing of the first and second differential signals includes arctangent processing.

16. The sensor of claim 11, wherein the sensor IC package is further configured to generate a second secondary angle position from the second and third sets of magnetic field sensing elements.

17. A sensor, comprising:

a sensor IC package having a first magnetic field sensing means located at a first position and a second magnetic field sensing means located at a second position, and a third magnetic field sensing means located at a third position between the first and second positions, wherein the first, second, and third magnetic field sensing means each have a first magnetic field sensing element, not shared with any other of the first, second or third sets, with a first axis of sensitivity and a second magnetic field sensing element, not shared with any other of the first, second or third sets, with a second axis of sensitivity, wherein the first and second axes of sensitivity are orthogonal, and wherein the first, second, and third magnetic field sensing means are aligned on a common line, wherein the sensor IC package is configured to:

process a first differential signal comprising signals for the first axis of sensitivity from the first and second magnetic field sensing means and a second differential signal comprising signals for the second axis of sensitivity from the first and second magnetic field sensing means to determine an absolute position of the target comprising a two-pole magnet, wherein the first and second axes of sensitivity and the common line are perpendicular to an axis about which the target rotates, said processing including performing offset and gain correction on the first and second differential signals;

generate a first secondary angle position from the first and third magnetic field sensing means;

compare a difference between the absolute position of the target and the first secondary angle position to a first threshold; and identify a fault in the sensor IC package based on said comparison.

18. The sensor according to claim 17, wherein the absolute position of the target is determined within a quadrant from positive or negative signs of the first and second differential signals.

19. The sensor according to claim 18, wherein the quadrant of the target is determined without arctangent processing of the first and second differential signals for low power operation.

20. The sensor of claim 17, wherein the sensor IC package is further configured to generate a second secondary angle position from the second and third sets of magnetic field sensing elements.

* * * * *

UNITED STATES PATENT AND TRADEMARK OFFICE
CERTIFICATE OF CORRECTION

| | | |
|---|---|---|
| PATENT NO. | : 12,111,153 B2 | Page 1 of 1 |
| APPLICATION NO. | : 17/344295 | |
| DATED | : October 8, 2024 | |
| INVENTOR(S) | : Yannick Vuillermet et al. | |

It is certified that error appears in the above-identified patent and that said Letters Patent is hereby corrected as shown below:

In the Specification

Column 7, Line 36 delete "x axes." and replace with --z axes.--.

In the Claims

Column 12, Lines 49-50 delete "set magnetic" and replace with --set of magnetic--.

Signed and Sealed this
Twenty-fifth Day of March, 2025

Coke Morgan Stewart
*Acting Director of the United States Patent and Trademark Office*